United States Patent
Mellinger et al.

(10) Patent No.: US 6,940,778 B2
(45) Date of Patent: Sep. 6, 2005

(54) SYSTEM AND METHOD FOR REDUCING LEAKAGE IN MEMORY CELLS USING WORDLINE CONTROL

(75) Inventors: Todd W. Mellinger, Fort Collins, CO (US); J. Michael Hill, Fort Collins, CO (US); Jonathan E. Lachman, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 142 days.

(21) Appl. No.: 10/697,679

(22) Filed: Oct. 29, 2003

(65) Prior Publication Data

US 2005/0105323 A1 May 19, 2005

(51) Int. Cl.⁷ ................................................ G11C 7/00
(52) U.S. Cl. .................. 365/227; 365/154; 365/230.06
(58) Field of Search ................................. 365/227, 154, 365/230.06

(56) References Cited

U.S. PATENT DOCUMENTS

| | | | | |
|---|---|---|---|---|
| 4,768,166 A | * | 8/1988 | Anami | 365/154 |
| 5,276,652 A | * | 1/1994 | Anami | 365/227 |
| 6,735,143 B2 | * | 5/2004 | Houston | 365/227 |

* cited by examiner

Primary Examiner—Huan Hoang
(74) Attorney, Agent, or Firm—John Pessetto

(57) ABSTRACT

An embodiment of the invention provides a circuit for reducing power in memory cells. The input of the circuit is connected to the wordline of the memory cells. When the wordline is active, the output of the circuit applies a voltage near VDD to the positive voltage supply node of the memory cells. When the wordline is inactive, the output of the circuit applies a voltage that is reduced by at least one $V_t$ from VDD to the positive voltage supply node of the memory cells.

10 Claims, 6 Drawing Sheets

SYSTEM AND METHOD FOR REDUCING
LEAKAGE IN MEMORY CELLS USING
WORDLINE CONTROL

FIELD OF THE INVENTION

This invention relates generally to electronic circuits. More particularly, this invention relates to reducing average power in memory cells.

BACKGROUND OF THE INVENTION

As more electronic circuits are included on a single die, the power dissipated by a single die continues to increase. In order to keep a single IC (integrated circuit) at a reasonable temperature, many techniques have been used. For example, elaborate cooling fins have been attached to the substrate of ICs. Also, fans have been positioned near a group of IC's to cool them. In some cases, liquids have been used to remove the heat produced by ICs. These solutions can be costly and may require a great deal of space, where space is at a premium. If the power on ICs can be reduced while still achieving higher levels of integration, the cost and area of devices that use ICs may be reduced.

The number of bits contained on a semiconductor memory chip, has, on average, quadrupled every three years. As a result, the power that semiconductor memories consume has increased. Computer systems may use large numbers of stand-alone semiconductor memories. Part of the semiconductor memory used by these computer systems may be held in standby mode for a certain amount of time. The portion of memory that is held in standby is not accessed for data and as result, has lower power requirements than those parts of semiconductor memory that are accessed.

Part of the power used in stand-by mode is created by subthreshold and gate leakage currents in each individual memory cell of the semiconductor memory. Because the amount of memory used in a computer system or as part of a microprocessor chip is increasing, the power, as result of leakage currents in semiconductor memory cells is also increasing. Typically, leakage is proportional to the voltage applied to a memory cell.

Several methods have been used to reduce subthreshold leakage in memory cells. One method increases the $V_t$ of the transistors in the memory cell. Another method increases the thickness of the gate oxide of the transistors in the memory cell. These methods typically require extra processing steps. These extra processing steps increase the cost of an IC. In addition these methods may reduce the speed at which data may be accessed from the memory cells.

Another method for reducing power used by memory cells is to provide a separate lower voltage power supply for memory cells. This method requires a more complex package for an IC and more design effort to physically route another power supply. As result, the cost of a packaged IC typically increases.

There is a need in the art to reduce the power consumed by memory cells. An embodiment of this invention reduces the power used by memory cells without significantly increasing the cost of a packaged IC or without significantly increasing the data access times of the memory cells.

SUMMARY OF THE INVENTION

An embodiment of the invention provides a circuit for reducing power in memory cells. The input of the circuit is connected to a wordline of the memory cells. When the wordline is active, the output of the circuit applies a voltage near VDD to the positive voltage supply node of the memory cells. When the wordline is inactive, the output of the circuit applies a voltage that is reduced by at least one $V_t$ from VDD to the positive voltage supply node of the memory cells.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
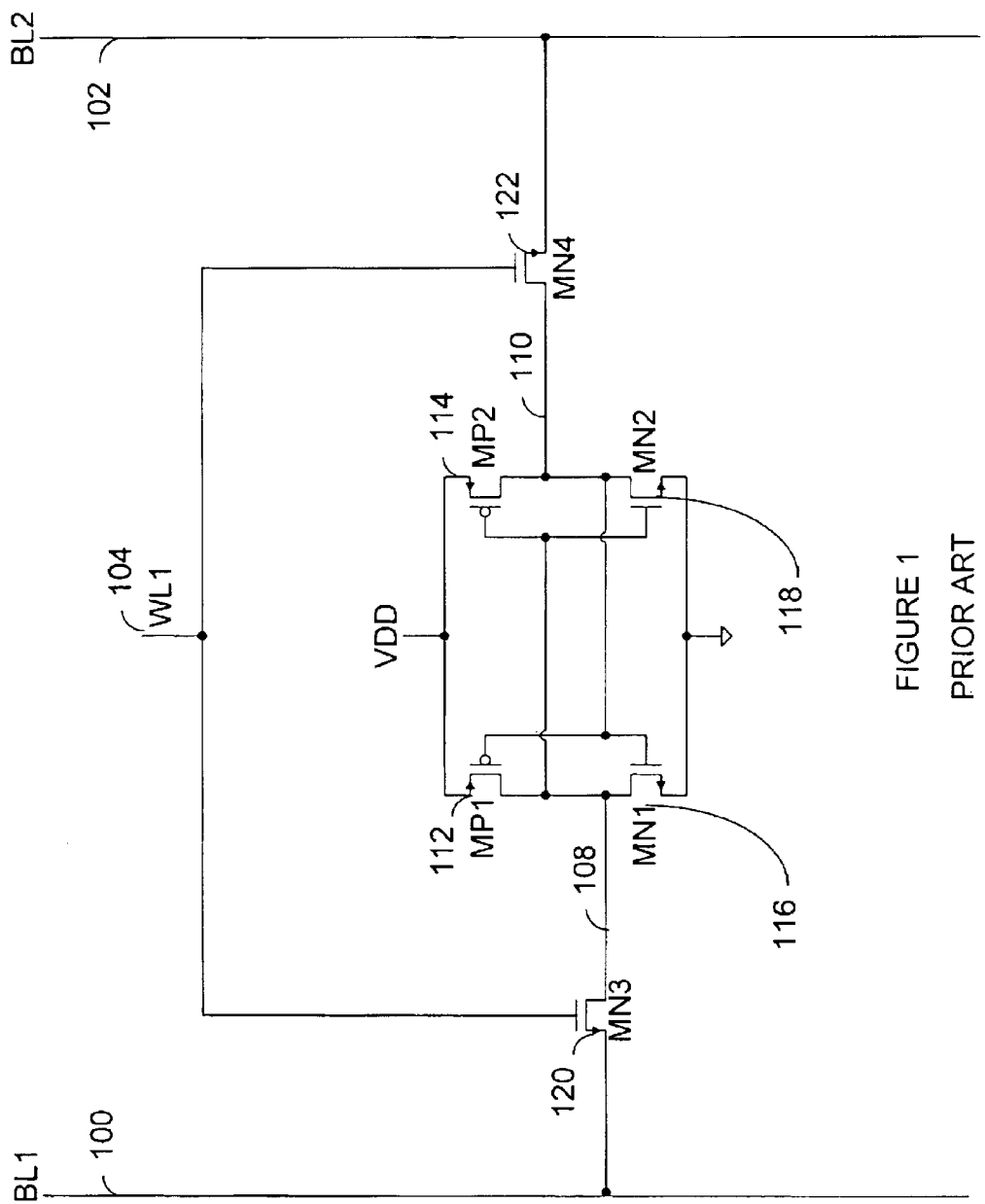
FIG. 1 is a schematic drawing of a 6 transistor SRAM cell. Prior Art

FIG. 1 is a schematic drawing of a 6 transistor SRAM cell. This memory cell is used as an example of a memory cell that may be used with an embodiment of the invention to reduce power in memory arrays. Other memory cells may be used with other embodiments of the invention to reduce power in memory arrays.

In FIG. 1, the sources, of PFETs (P-type Field Effect Transistor) MP1, 112, and MP2, 114 are connected to positive power supply, VDD. The drain of PFET, MP1, 112, the drain of NFET (N-type Field Effect Transistor), MN1, 116, the drain of NFET, MN3, 120, the gate of PFET, MP2, 114 and the gate of NFET, MN2, 118 are connected to node 108. The sources of NFETs, MN1, 116, and MN2, 118, are connected to GND. The drain of PFET, MP2, 114, the drain of NFET, MN2, 118, the drain of NFET, MN4, 122, the gate of PFET, MP1, 112, and the gate of NFET, MN1, 116, are connected to node 110. The gates of NFETs, MN3, 120, and MN4, 122 are connected to wordline, WL1, 104. Bitline, BL1, 100 is connected to the source of NFET, MN3, 120. Bitline, BL2, 102 is connected to the source of NFET, MN4, 122.

Data is typically read from the SRAM cell in FIG. 1 by applying a logical "one" on WL1, 104. BL1, 100, and BL2, 102, are typically pre-charged to a voltage at or near VDD, before the data is read from the SRAM cell. One of the bitlines, BL1, 100, or BL2, 102, is discharged to a voltage lower than the precharge voltage while the other bitline remains near its precharged value when the SRAM cell is read. The differential voltage between BL1, 100 and BL2, 102, is usually detected by a sense-amp and the sense-amp outputs a logical one or zero depending on the differential voltage on the bitlines, BL1, 100, and BL2, 102.

Writing the SRAM cell in FIG. 1 is typically achieved by applying a logical high value on one bitline and a logical low value on the other bitline while driving the wordline, WL1, 104, to a high value. The logical value on BL1, 100, is forced on the node, 108, of the SRAM cell, while the opposite logical value on BL2, 102, is forced on the node 110 of the SRAM cell.

Figure 2:
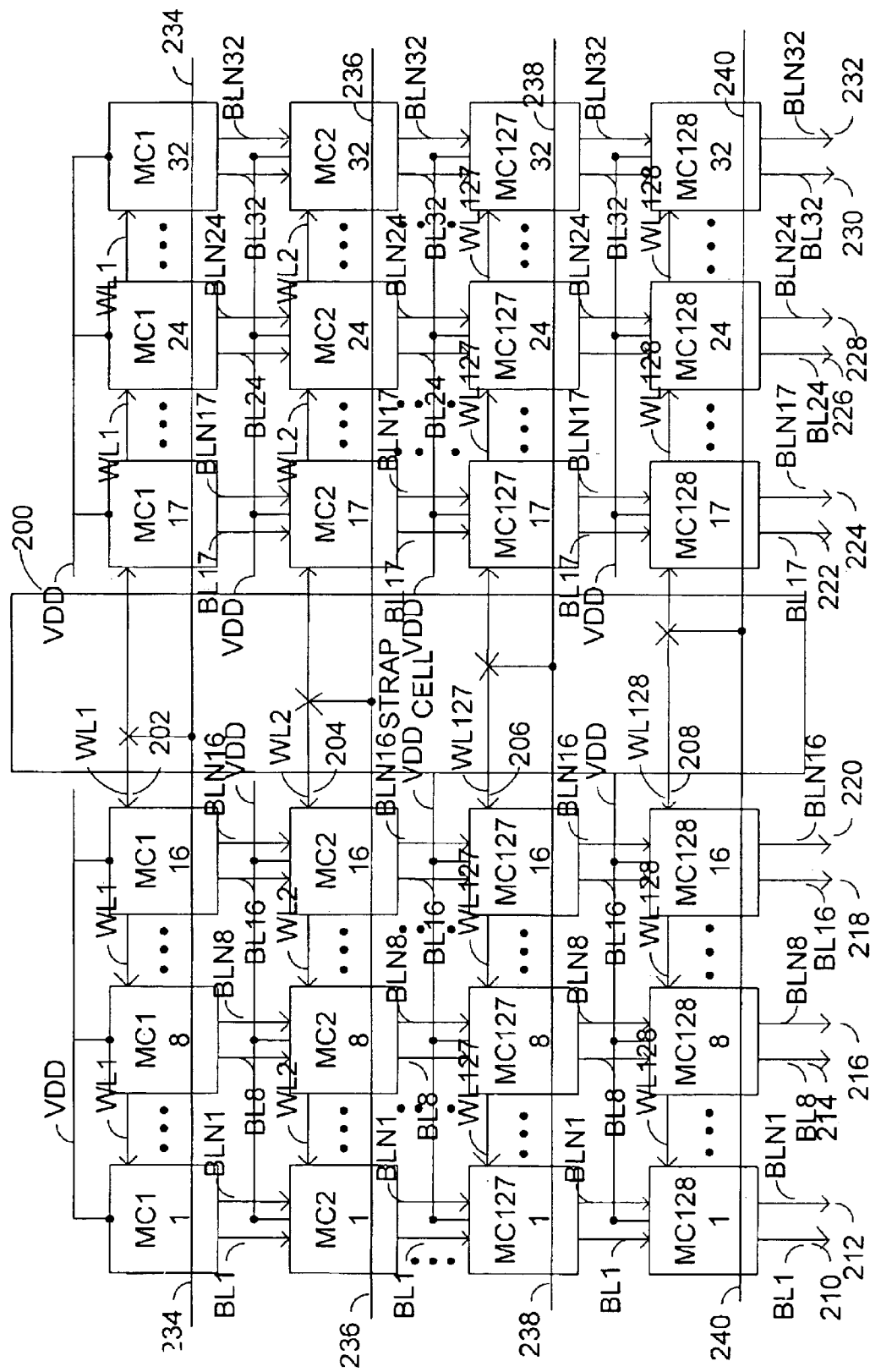
FIG. 2 is a block diagram of a memory array with 128 wordlines with 32 memory cells on each wordline. Prior Art

FIG. 2 is a block diagram of a memory array with 128 wordlines with 32 memory cells on each wordline. The strap cell, 200, shown in FIG. 2, does nothing from a logical perspective but it used to implement the physical layout of the memory array.

For area efficiency, memory cells are typically small enough to where they don't have room to contact the wordlines from the higher metal layers into each cell. The strap cell, 200, provides this function. For example, a metal line wordline, 234, connects to a poly-silicon wordline, WL1, 202. The poly-silicon wordline, WL1, 202, makes connections to the appropriate transistors in memory cells, MC1/1 through MC1/32. Metal wordlines, 236, 238, and 240 provide connections to poly-silicon wordlines, WL2, 204, WL127, 206, and WL128, 208 respectively. In FIG. 2, the positive supply voltage, VDD, is applied to all the memory cells. VDD, in this example, is designed to remain a constant voltage.

Figure 3:
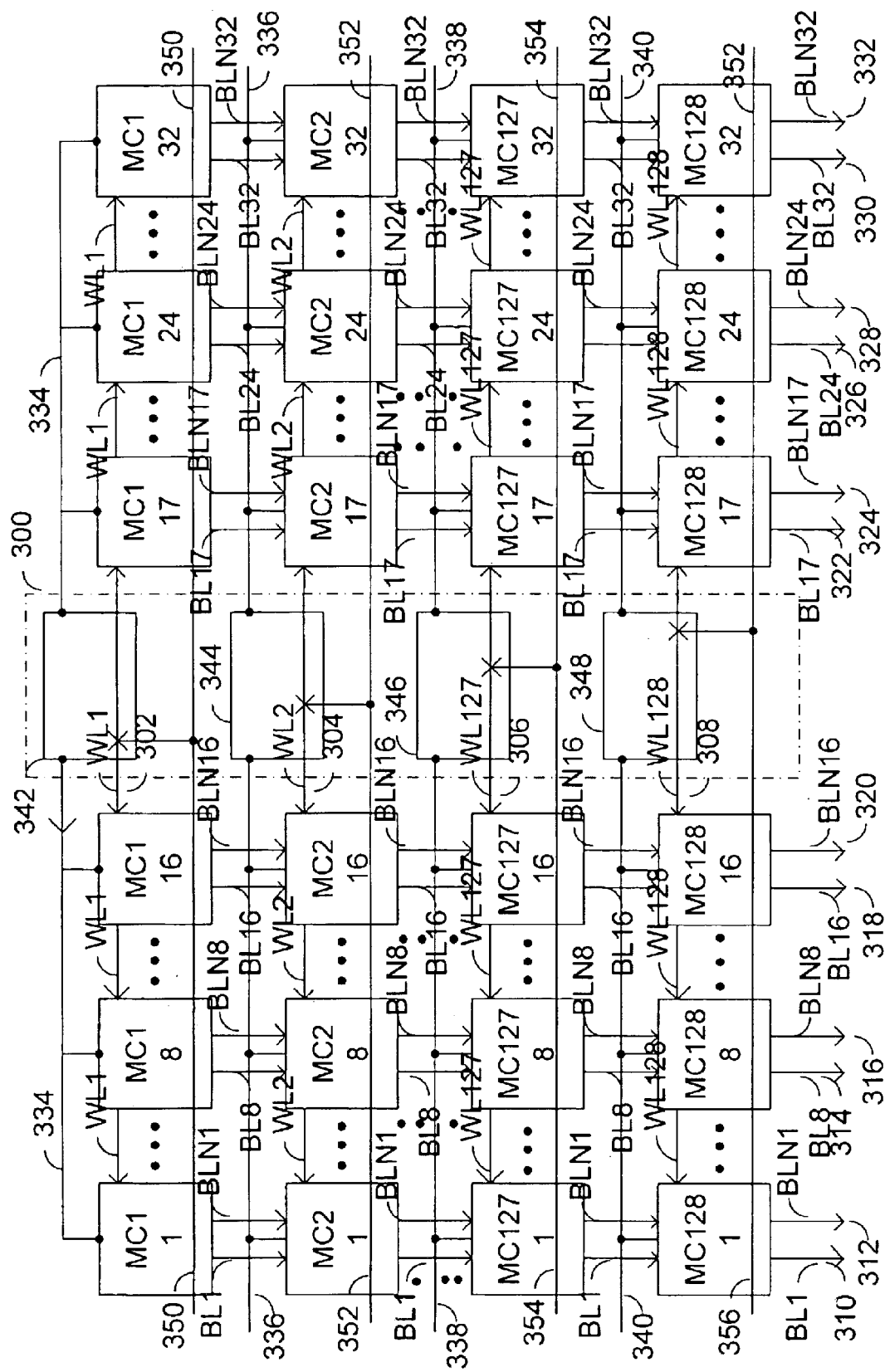
FIG. 3 is a block diagram of a memory array with 128 wordlines with 32 memory cells on each wordline using an embodiment of the invention.

FIG. 3 is a block diagram of a memory array with 128 wordlines with 32 memory cells on each wordline using an embodiment of the invention. The strap cell, 300, shown in FIG. 3, in addition to providing a method to connect metal wordlines to poly-silicon wordlines, contains an embodiment of the invention. For example, in FIG. 3, metal wordline, 350, is connected to poly-silicon worldine, WL1, 302. In addition, wordline, WL1, 350, is an input to an embodiment of the invention, 342. The output of an embodiment of the invention, 342, is connected to the positive voltage supply node, 334 of the memory cells, MC1/1 through MC1/32. When the wordline, 350, is driven to a high logical value, the output of an embodiment of the invention, 342, provides a voltage near VDD to the positive voltage supply node 334.

When the wordline, 350, is driven to a low logical value, the output of an embodiment of the invention, 342, provides a voltage at least one $V_t$ below VDD to the positive voltage supply node 334. When the voltage applied to positive supply node 334 is reduced, the power consumed by memory cells, MC1/1 through MC1/32 is reduced.

Figure 4:
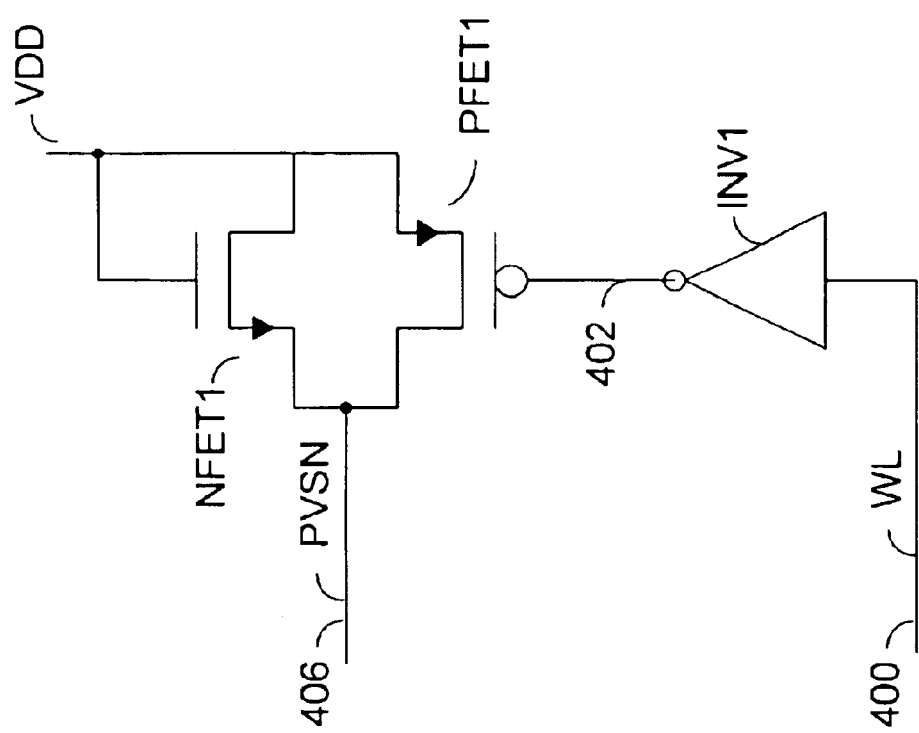
FIG. 4 is a schematic drawing of a first embodiment of the invention.

FIG. 4 is a schematic drawing of a first embodiment of the invention. A wordline, WL, for example, is connected to the input, 400, of inverter, INV1. The output, 402, of inverter, INV1, is connected to the gate, 402, of PFET, PFET1. The source of PFET1, the drain of NFET1, and the gate of NFET1 are connected to VDD. The drain, 406, of PFET1, and the source, 406, of NFET1, are connected to a positive voltage supply node, PVSN, of a group of memory cells.

In FIG. 4, when the WL, 400, goes to a high logical value, the output, 402, of the inverter, INV1, goes low. A low logical value on the gate of PFET1 causes PFET1 to turn on and transfers a voltage close to VDD to the positive voltage supply node, PVSN, 406. When WL, 400, goes to a low logical value, the output, 402, of inverter, INV1, goes to a high logical value. A high logical value on the gate of PFET1, cause PFET1 to turn off. NFET1 is configured as diode and as consequence of the leakage of the memory cells supplied by PVSN, the voltage on the positive voltage supply node, PVSN, 406 droops to near VDD–$V_t$.

Figure 5:
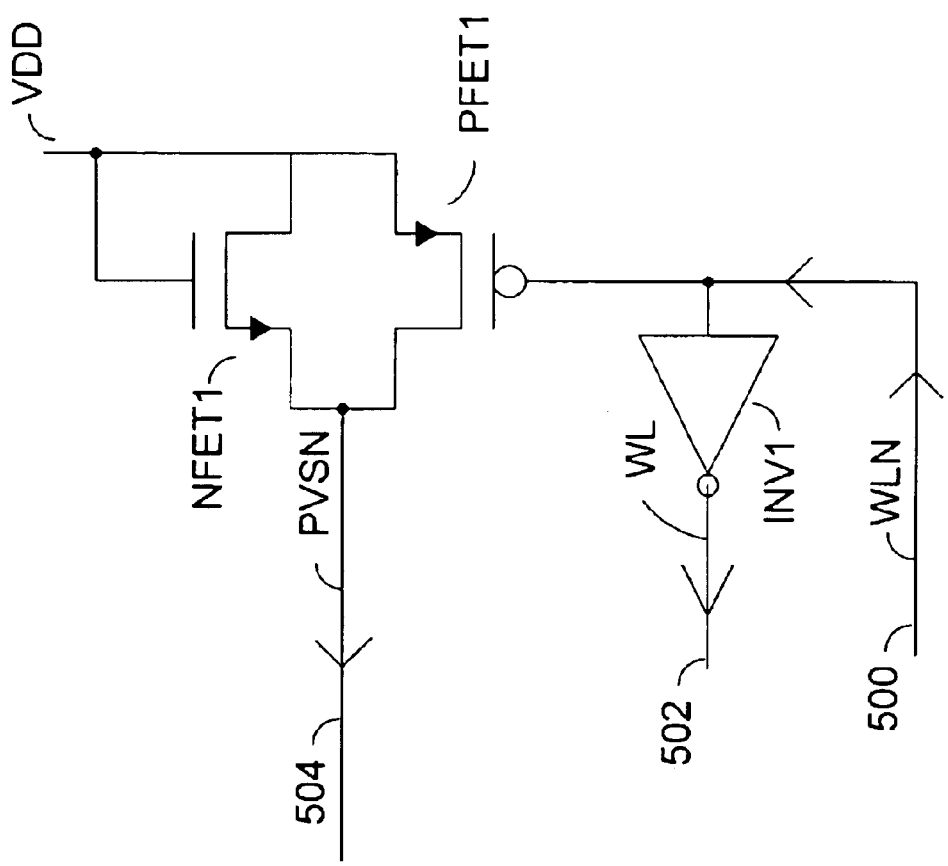
FIG. 5 is a schematic drawing of a second embodiment of the invention.

FIG. 5 is a schematic drawing of a second embodiment of the invention. In this embodiment an active-low wordline WLN, 500, is connected to the input of an inverter, INV1, and to the gate of PFET1. The output, 502, of the inverter, INV1 is connected to a local wordline, WL. The source of PFET1, the drain of NFET1, and the gate of NFET1 are connected to VDD. The drain of PFET1 and the source of NFET1 are connected to a positive voltage supply node, PVSN, 504, of a group of memory cells.

In FIG. 5, when the active-low wordline, WLN, 500, goes to a low logical value, the output, 502, local wordline WL, of the inverter, INV1, goes high. A low logical value on the gate of PFET1 causes PFET1 to turn on and transfers a voltage close to VDD to the positive voltage supply node, PVSN, 504. When the active-low wordline, WLN, 500, goes to a high logical value, the local wordline WL, 502, of inverter, INV1, goes to a low logical value. A high logical value on the gate of PFET1, cause PFET1 to turn off. NFET1 is configured as diode and as consequence of the leakage of the memory cells supplied by PVSN, the voltage on the positive voltage supply node, PVSN, 504, droops to near VDD–$V_t$.

Figure 6:
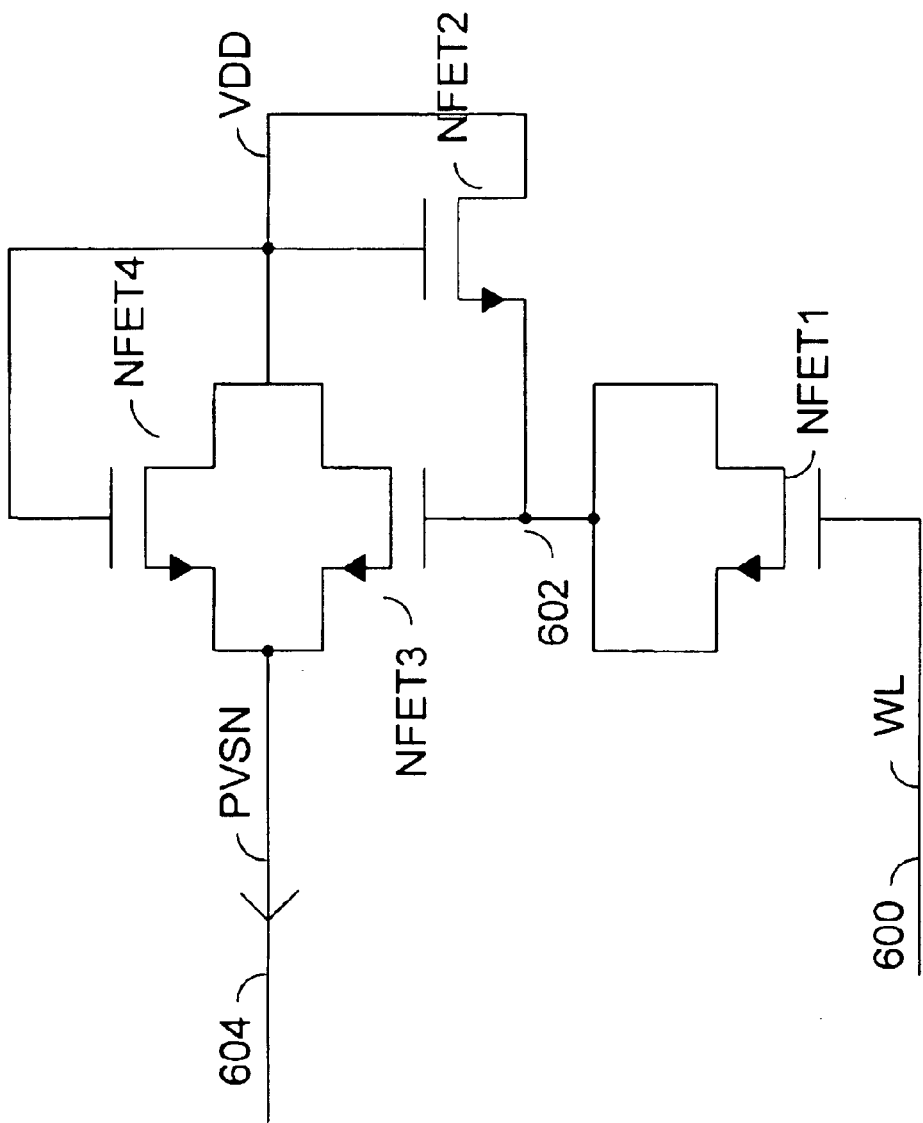
FIG. 6 is a schematic drawing of a third embodiment of the invention.

FIG. 6 is a schematic drawing of a third embodiment of the invention. In this embodiment, WL, 600, is connected to the gate of NFET1. The drain of NFET1, the source of NFET1, and the source of NFET2 are connected to the gate of NFET3. The drain of NFET2, the drain of NFET3, the drain of NFET4, the gate of NFET2, and the gate of NFET4 are connected to VDD. The source of NFET3 and the source of NFET4 are connected to positive voltage supply node, PVSN, 604.

In FIG. 6, when WL, 600, goes high, it boot-straps the voltage on node 602 above VDD. Since the voltage on the gate of NFET3 is high enough above VDD, VDD may be transferred to the positive voltage supply node, PVSN, 604. When WL, 600, goes low, the voltage on node 602 is not high enough to turn NFET3 on. NFET4 is configured as diode and as consequence of the leakage of the memory cells supplied by PVSN, the voltage on the positive voltage supply node, PVSN, 604, droops to near VDD–$V_t$.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system for reducing power in memory cells comprising:
   a) a circuit, the circuit having an input and an output;
   b) wherein the input is connected to a wordline of the memory cells;
   c) wherein the output is connected to a positive voltage supply node of the memory cells;
   d) wherein a first voltage applied to the output is reduced by at least one $V_t$ from a supply voltage, VDD, when the wordline is inactive;
   e) wherein a second voltage applied to the output is near the supply voltage, VDD, when the wordline is active.

2. The system as in claim 1 wherein the memory cells are SRAM cells.

3. The system as in claim 1 wherein the memory cells are DRAM cells.

4. The system as in claim 1 wherein the circuit comprises:
a) an inverter, the inverter having an input and an output;
b) an NFET, the NFET having a gate, a drain, and a source;
c) a PFET, the PFET having a gate, a drain, and a source;
d) wherein the input of the inverter is connected to the input of the circuit;
e) wherein the output of the inverter is connected to the gate of the PFET;
f) wherein the source of the PFET, the gate of the NFET, and the drain of the NFET are connected to the supply voltage, VDD;
g) where in drain of the PFET and the source of the NFET are connected to the output of the circuit.

5. A system as in claim 1 wherein the circuit comprises:
a) a first NFET, the first NFET having a gate, a drain, and a source;
b) a second NFET, the second NFET having a gate, a drain, and a source;
c) a third NFET, the third NFET having a gate, a drain, and a source;
d) a fourth NFET, the fourth NFET having a gate, a drain, and a source;
e) wherein the gate of the first NFET is connected to the input of the circuit;
f) wherein the drain and the source of the first NFET is connected to the source of the second NFET and to the gate of the third NFET;
g) wherein the drain of the second NFET, the gate of the second NFET, the drain of the third NFET, the drain of the fourth NFET, and the gate of the fourth NFET are connected to the supply voltage, VDD;
h) wherein the source of the third NFET, and the source of the fourth NFET are connected to the output of circuit.

6. A system for reducing power in memory cells comprising:
a) a circuit, the circuit having an input, a first output, and a second output;
b) wherein the input is connected to an active-low wordline;
c) wherein the first output is connected to a local wordline of the memory cells;
d) wherein the second output is connected to a positive voltage supply node of the memory cells;
e) wherein a first voltage applied to the second output is reduced by at least one $V_t$ from a supply voltage, VDD, when the active low wordline is high;
f) wherein a second voltage applied to the second output is near the supply voltage, VDD, when the active-low wordline is low.

7. The system as in claim 6 wherein the circuit comprises:
a) an inverter, the inverter having an input and an output;
b) an NFET, the NFET having a gate, a drain, and a source;
c) a PFET, the PFET having a gate, a drain, and a source;
d) wherein the input of the inverter is connected to the input of the circuit;
e) wherein the output of the inverter is connected to the first output of the circuit;
f) wherein the source of the PFET, the gate of the NFET, and drain of the NFET are connected to the supply voltage, VDD;
g) wherein the drain of the PFET and the source of the NFET are connected to the second output of the circuit.

8. A method for manufacturing a circuit for reducing power in memory cells comprising:
a) fabricating an inverter, the inverter having an input and an output;
b) fabricating an NFET, the NFET having a gate, a drain, and a source;
c) fabricating a PFET, the PFET having a gate, a drain, and a source;
d) wherein the input of the inverter is connected to a wordline of the memory cells;
e) wherein the output of the inverter is connected to the gate of the PFET;
f) wherein the source of the PFET, the gate of the NFET, and drain of the NFET are connected to the supply voltage, VDD;
g) wherein the drain of the PFET and the source of the NFET are connected to a positive voltage supply node of the memory cells.

9. A method for manufacturing a circuit for reducing power in memory cells comprising:
a) fabricating a first NFET, the first NFET having a gate, a drain, and a source;
b) fabricating a second NFET, the second NFET having a gate, a drain, and a source;
c) fabricating a third NFET, the third NFET having a gate, a drain, and a source;
d) fabricating a fourth NFET, the fourth NFET having a gate, a drain, and a source;
e) wherein the gate of the first NFET is connected to the wordline of the memory cells;
f) wherein the drain and the source of the first NFET is connected to the source of the second NFET and to the gate of the third NFET;
g) wherein the drain of the second NFET, the gate of the second NFET, the drain of the third NFET, the drain of the fourth NFET, and the gate of the fourth NFET are connected to the supply voltage, VDD;
h) wherein the source of the third NFET, and the source of the fourth NFET are connected to a positive voltage supply node of the memory cells.

10. A method for manufacturing a circuit for reducing power in memory cells comprising:
a) fabricating an inverter, the inverter having an input and an output;
b) fabricating an NFET, the NFET having a gate, a drain, and a source;
c) fabricating a PFET, the PFET having a gate, a drain, and a source;
d) wherein the input of the inverter is connected to an active low wordline;
e) wherein the output of the inverter is connected to a local wordline of the memory cells;
f) wherein the source of the PFET, the gate of the NFET, and the drain of the NFET are connected to the supply voltage, VDD;
g) wherein the drain of the PFET and the source of the NFET are connected to a positive voltage supply node of the memory cells.

* * * * *

UNITED STATES PATENT AND TRADEMARK OFFICE
CERTIFICATE OF CORRECTION

| | | |
|---|---|---|
| PATENT NO. | : 6,940,778 B2 | Page 1 of 1 |
| APPLICATION NO. | : 10/697679 | |
| DATED | : September 6, 2005 | |
| INVENTOR(S) | : Todd W. Mellinger et al. | |

It is certified that error appears in the above-identified patent and that said Letters Patent is hereby corrected as shown below:

In column 5, line 14, in Claim 4, delete "where in" and insert -- wherein the --, therefor.

In column 5, line 51, in Claim 6, delete "active low" and insert -- active-low --, therefor.

Signed and Sealed this

Fourth Day of August, 2009

JOHN DOLL
*Acting Director of the United States Patent and Trademark Office*